United States Patent
Nicholson (10) Patent No.: US 6,701,204 B1
(45) Date of Patent: *Mar. 2, 2004

(54) SYSTEM AND METHOD FOR FINDING DEFECTIVE TOOLS IN A SEMICONDUCTOR FABRICATION FACILITY

(75) Inventor: Mark Nicholson, Stocksfield (GB)

(73) Assignees: Mosel Vitelic Inc., Hsinchu (TW); ProMOS Technologies, Inc., Hsinchu (TW); Infineon Technologies, Inc., Munich (DE)

( * ) Notice: Subject to any disclaimer, the term of this patent is extended or adjusted under 35 U.S.C. 154(b) by 0 days.

This patent is subject to a terminal disclaimer.

(21) Appl. No.: 09/577,695

(22) Filed: May 22, 2000

(51) Int. Cl.$^7$ ............................................ G06F 19/00
(52) U.S. Cl. .................... 700/121; 700/108; 700/175; 438/14; 716/4
(58) Field of Search .................. 700/95, 108–111, 700/117, 119–121, 174–177; 716/2–4; 438/10, 11, 14–18; 702/35, 182–185

(56) References Cited

U.S. PATENT DOCUMENTS

| | | | | |
|---|---|---|---|---|
| 5,240,866 A | * | 8/1993 | Friedman et al. ............. | 702/35 |
| 5,716,856 A | * | 2/1998 | Lin et al. ...................... | 438/14 |
| 5,761,065 A | * | 6/1998 | Kittler et al. ................ | 700/117 |
| 5,963,881 A | * | 10/1999 | Kahn et al. ................... | 702/35 |
| 6,073,501 A | * | 6/2000 | Rohner ....................... | 73/865.8 |
| 6,349,240 B2 | * | 2/2002 | Ogawa et al. .............. | 700/121 |
| 6,363,294 B1 | * | 3/2002 | Coronel et al. ............. | 700/121 |
| 6,446,017 B1 | * | 9/2002 | Skidmore .................... | 702/81 |
| 6,496,958 B1 | * | 12/2002 | Ott et al. ....................... | 716/4 |
| 6,507,933 B1 | * | 1/2003 | Kirsch et al. .................. | 716/4 |
| 6,535,776 B1 | * | 3/2003 | Tobin et al. ................ | 700/110 |
| 6,563,300 B1 | * | 5/2003 | Jackson et al. .......... | 324/158.1 |
| 6,580,960 B1 | * | 6/2003 | Nicholson ................... | 700/121 |

\* cited by examiner

*Primary Examiner*—Maria N. Von Buhr
(74) *Attorney, Agent, or Firm*—Blakely, Sokoloff, Taylor & Zafman, LLP (57) ABSTRACT

A system and method for finding a defective tool in a semiconductor fabrication facility is disclosed. When the tools process the wafers, data representing the time period during which each wafer passes through each tool is sent to a database. The wafers are tested for defects, and lots having wafers with common failure signatures are determined. A lot list for each tool is generated, a positive weight value is assigned to each bad lot, and a negative weight value is assigned to each good lot. A cumulative value is calculated for each tool by sequentially adding the weight values of each lot in the lot list and keeping the cumulative value above or equal to zero. The tool with the largest maximum cumulative value is the tool that is most likely to be defective.

23 Claims, 5 Drawing Sheets

SYSTEM AND METHOD FOR FINDING DEFECTIVE TOOLS IN A SEMICONDUCTOR FABRICATION FACILITY

FIELD OF THE INVENTION

This invention relates to semiconductor manufacturing processes, and more particularly, to an improved system and method for finding the defective tools in a fabrication facility used in processing semiconductor wafers.

BACKGROUND OF THE INVENTION

In order to produce a particular circuitry on a semiconductor wafer, the wafer has to pass through several processing steps. These processing steps involve depositing material layers and forming patterns on these material layers by photolithography, ion implantation, and thermal annealing, etc. Each of these processing steps must be performed perfectly on a wafer in order to produce functional circuitry. Each of the processing steps is monitored to detect for errors.

To ensure that the circuitry be fully functional, in-line testers conduct electrical and/or physical tests on the wafers after certain key process steps, and the test data is sent to various diagnostic tools to determine whether any errors occurred in that particular process. For example, after a series of implantation processes are performed, the wafer is examined to see if any defects have formed, or if the number of defects has exceeded a threshold level. If a defect is detected, or if the number of defects exceeds a threshold level, an operator adjusts the process immediately to ensure proper operation. After a wafer has gone through all the required processing steps, more comprehensive electrical and/or physical tests are then performed on each die on the wafer to ensure that the circuitry is functional. If defects are detected, then operators trace the processing history of the wafer and determine which process went wrong and generated the defects.

Methods have been developed in the past to determine the defective process. One method is the process-based commonality analysis. Because a semiconductor fab typically has several production lines running simultaneously, an operator may locate the defective process by finding a common process that all of the defective wafers have passed through. Suppose the wafers having high defective rates all went through a particular ion-implantation process, and wafers which did not go through that particular ion-implantation process had very few defects, then it is likely that the ion-implantation process is the source of the defects. By finding the common processes for which the defective wafers have gone through, the process-based commonality analysis provides a way of finding faulty processes.

One problem with such process-based commonality analysis is that each process may involve more than one tool. Moreover, each tool may be involved in more than one process. Thus, if a tool malfunctions, more than one process may be affected. By performing the process-based commonality analysis, an operator may determine that the defects come from more than one process. Subsequent efforts have to be spent to determine the exact cause of the defects. Moreover, a tool may have intermittent problems in which the tool functions normally during certain periods of time, but functions abnormally during other periods of time. Because the tool generates defects intermittently, sometimes the defects occur in one process while at other times the defects occur in another process. The process-based commonality analysis is likely to fail because no single process can be found to have processed all the defective wafers.

Thus, a more effective system and method of finding the cause of errors in the manufacturing process is desired.

SUMMARY OF THE INVENTION

A system and method for identifying a defective tool in a semiconductor fabrication facility is disclosed. The system includes an electrical parameter tester for identifying the defects on wafers, a failure signature analyzer for identifying a failure signature on the wafers having defects, a memory for storing a set of data representing the time period during which each wafer passed through each tool, and an equipment commonality analyzer for determining the tool that is mostly to likely to have caused the failure signature. The method includes the steps of processing wafers with the tools, generating a database containing information on the time period during which each wafer passed through each tool, determining the failure signature of the defective wafers, generating a lot list for each tool, assigning a weight value to each lot in the lot list, generate a cumulative value for each tool by sequentially adding the weight values of each lot in said lot list and keeping the cumulative value above or equal to zero, and assigning the tool with the largest maximum cumulative value as the tool most likely to have caused the failure signature.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE INVENTION

Equipment Commonality Analysis

This invention uses commonality analysis on a tool-by-tool basis. A tool may be a single machine or equipment used to perform a single function. A tool may be used in more than one process. For example, the stepper tool performs the function of photolithography and can be used in the process of forming isolation regions and the process of forming polysilicon gates. When a tool processes a wafer or a wafer lot, the beginning and end time of the period during which a wafer or wafer lot passes through the tool are recorded and sent to a wafer database. By retrieving data from the wafer database, when a particular wafer was processed by which tool in the fab can be determined.

Electrical and/or physical tests are performed on the dies of a wafer after all the processing steps have been completed. The test data is collected to generate a wafer map, which shows the regions on the wafer with defects. By visually inspecting the wafer maps, an operator may classify the defects into different types, and assign a failure signature to each type of defect pattern. For example, one type of defect pattern having defects clustering around the center region of the wafer may be called "center spot". Another type of defect pattern may be called "random distribution", which means that the defects are scattered randomly on the wafer. The classification of defective wafers according to failure signatures can be done automatically. The test data may be sent to a computer implementing a pattern recognition software to match the defect patterns of wafers with failure signatures in a predefined failure signature database.

After the failure signatures of all the wafers or wafer lots are determined, an equipment commonality diagnosis is applied to determine which tool is likely to have caused the defects. If the defective wafers have a common failure signature, then the data relating to the defective wafers with that failure signature is retrieved from the wafer database. The data is analyzed to find the common tools for which all or most of the defective wafers have passed through. The tools are ranked according to cumulative weight values in the order of likelihood that they caused the defects.

An illustrative embodiment of the invention is described below. It will of course be appreciated that in the design of any such actual implementation, numerous implementation specific decisions must be made to achieve the designers' specific goals, such as compliance with manufacturing and business-related constraints, which will vary from one implementation to another. Moreover, it will be appreciated that such a design effort might be complex and time-consuming, but would nevertheless be a routine undertaking of semiconductor engineering for those of ordinary skill having the benefit of this disclosure.

Figure 1:
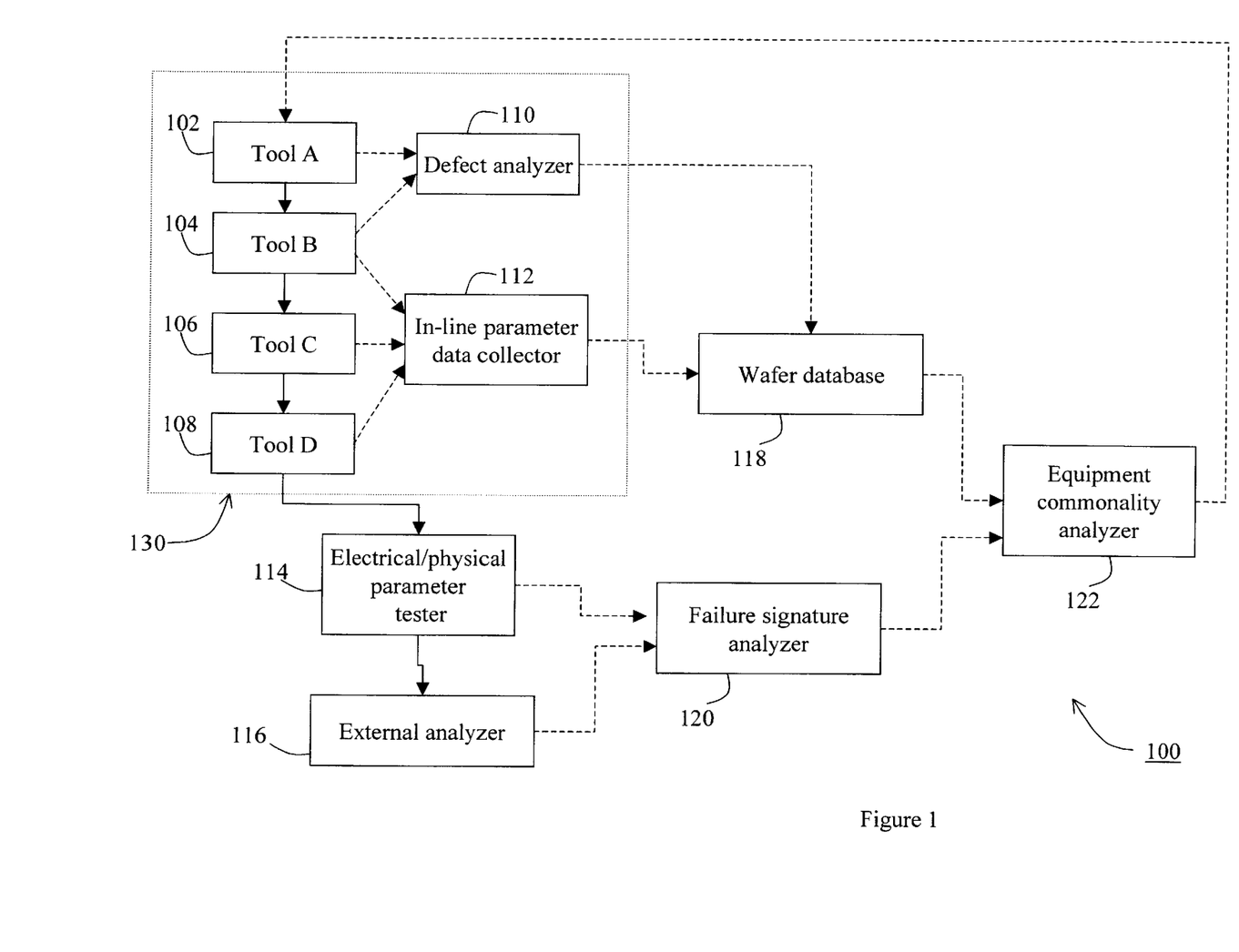
FIG. 1 shows a system block diagram of the present invention.

Referring to FIG. 1, a semiconductor processing system 100 incorporating the present invention is shown. The system 100 includes a fab 130, an electrical/physical parameter tester 114, an external analyzer 116, a wafer processing database 118, a failure signature analyzer 120, and an equipment commonality analyzer 122. The system 100 may also include a wafer sort machine in addition to the electrical/physical parameter tester 114 to assist in electrical testing. The fab 130 may be a semiconductor fabrication plant that manufactures integrated circuits on semiconductor wafers. The fab 130 includes a Tool A 102, a Tool B 104, a Tool C 106, a Tool D 108, a defect analyzer 110, and an in-line parameter data collector 112. The figure is merely a simplified diagram of a representative fab. An actual fab may have several hundreds of tools running simultaneously to process wafers. These wafers may have different patterned circuitry formed thereon.

The defect analyzer 110 analyzes wafers processed by Tool A 102 and Tool B 104, and informs an operator to adjust the tools if defects are found. The data collected by the defect analyzer 110 is sent to and stored in the wafer database 118 for further analysis. The in-line parameter data collector 112 collects data from Tool B 104, Tool C 106, and Tool D 108, such as data relating to oxide thickness, depth of etch-back, and certain critical device dimensions, etc. These data are also sent to and stored in the wafer database 118. The solid arrows in FIG. 1 represent the flow in which the wafers are sent from one machine to another. The dotted arrows in the FIG. 1 represent the flow of data sent from one machine to another. The configuration of the fab is used as illustration only. The in-line parameter data collector 112 may collect data from all of the tools, and the defect analyzer 110 may also analyze wafers processed by all of the tools.

Tool A 102, Tool B 104, Tool C 106, and Tool D 108 also send the "begin" and "end" time during which a wafer is processed by the tool to wafer database 118. In this way, which tool processed which wafer, and when the tool processed the wafer can all be determined from the data stored in the wafer database 118. The wafer database 118 also contains information on the lot number of each wafer. Typically, the wafers are sent through the tools in a "lot" container having about 25 wafers. Thus, an operator can determine which tool was processing a particular wafer or lot at any given time from the information stored in the database.

The electrical/physical parameter tester 114 tests electrical parameters of each die on a wafer for defects. The test data is then sent to the failure signature analyzer 120. The external analyzer 116 may include a microscope operated by an operator to spot fault patterns on a wafer by visual inspection. The external analyzer 116 could also be a pattern recognition machine capable of analyzing video images of the wafer. The data collected by the external analyzer 116 is also sent to the failure signature analyzer 120.

The failure signature analyzer 120 determines the failure signatures of the wafers from the test results generated by the electrical/physical parameter tester 114 and external analyzer 116. The failure signature analyzer 120 may generate a wafer map from the test data gathered by the electrical/physical parameter tester 114 and external analyzer 116, and find the failure signature using a pattern recognition method. The failure signature analyzer 120 may also compare the test data with a predefined failure signature database. Each different failure signature represents a particular defect pattern, and may be related to a particular kind of defect caused by a particular process or by a particular tool. For example, a defect pattern having curvilinear features may resemble a mechanical scratch, and may indicate that the tools used to polish the wafer may be defective. A defect pattern showing a grouping of low-density, sparse structures into amorphous clusters resembles the trail off of a teardrop shaped stain, and may indicate that certain liquids are contaminated with particles.

The equipment commonality analyzer 122 processes data on a lot basis. Wafers are grouped according to lots in which they were processed in the fab 130. If a lot has a wafer with a failure signature, then the lot is designated as a bad lot. Otherwise, the lot is designated as a good lot. A lot list for a particular tool is generated by sorting the lots processed by that tool according to the sequence in which the lots were processed. The sequence in which the wafers were processed by a certain tool can be determined from the time data stored in wafer database 118. For purpose of illustration, the following description assumes that twenty-eight lots have been processed, and lots number 5 to 11 are bad lots with wafer(s) having a particular failure signature.

As shown in Table 1 is the sequence in which Tool A 102, Tool B 104, Tool C 106, and Tool D 108 processed the twenty-eight wafer lots. Tool A processed lots #1 to #28 in sequence. Tool B 104 processed lot #1 first, then lots #2, #5, #3, and #4, and so on. Tool C 106 processed lot #1 to #8 first, then #12, then #9, and so on. Such different sequences may occur when a tool is used in more than one process, and different wafers undergo different processing steps and cross-mix among different tools.

TABLE 1

| Tool | Lot list (lot sequence in which the lots are processed) |
|---|---|
| A | (1, 2, 3, 4, 5, 6, 7, 8, 9, 10, 11, 12, 13, 14, 15, 16, 17, 18, 19, 20, 21, 22, 23, 24, 25, 26, 27, 28) |
| B | (1, 2, 5, 3, 4, 6, 7, 8, 12, 9, 13, 14, 15, 16, 17, 10, 18, 19, 20, 21, 11, 22, 23, 24, 25, 26, 27, 28) |
| C | (1, 2, 3, 4, 5, 6, 7, 8, 12, 9, 13, 14, 10, 15, 16, 11, 17, 18, 19, 20, 21, 22, 23, 24, 25, 26, 27, 28) |
| D | (5, 1, 2, 3, 4, 6, 7, 12, 8, 13, 14, 9, 15, 16, 10, 17, 18, 19, 20, 11, 21, 22, 23, 24, 25, 26, 27, 28) |

(bad lots with fail signature: 5, 6, 7, 8, 9, 10, 11)

The equipment commonality analyzer 122 is used to determine which tool caused the failure signature as determined by the failure signature analyzer 120. The equipment commonality analyzer 122 retrieves information from the wafer database 118 related to the "begin" and "end" time during which the lots are processed by each tool. The method used by the equipment commonality analyzer 122 for determining the defective tool is described in more detail hereinafter. If the failure signature analyzer 120 determines that there are more than one type of failure signatures, then for each failure signature, a separate set of lot lists for each tool is generated. The equipment commonality analyzer 122 is invoked to find the corresponding defective tool for each failure signature. The equipment commonality analyzer 122 may include an output display for displaying the results of its analysis.

As an example, suppose for a particular failure signature, the wafer lots having that particular failure signature only goes through tools A, B, and C, then only the lot list for tools A, B, and C will be generated and analyzed for that particular failure signature. For different failure signatures, lots having the failure signatures may occur at different time frames, thus the lot lists may comprise of different lot sequences. As an example, for a different failure signature, it is possible that the lots #10 through #35 need to be analyzed.

Figure 2:
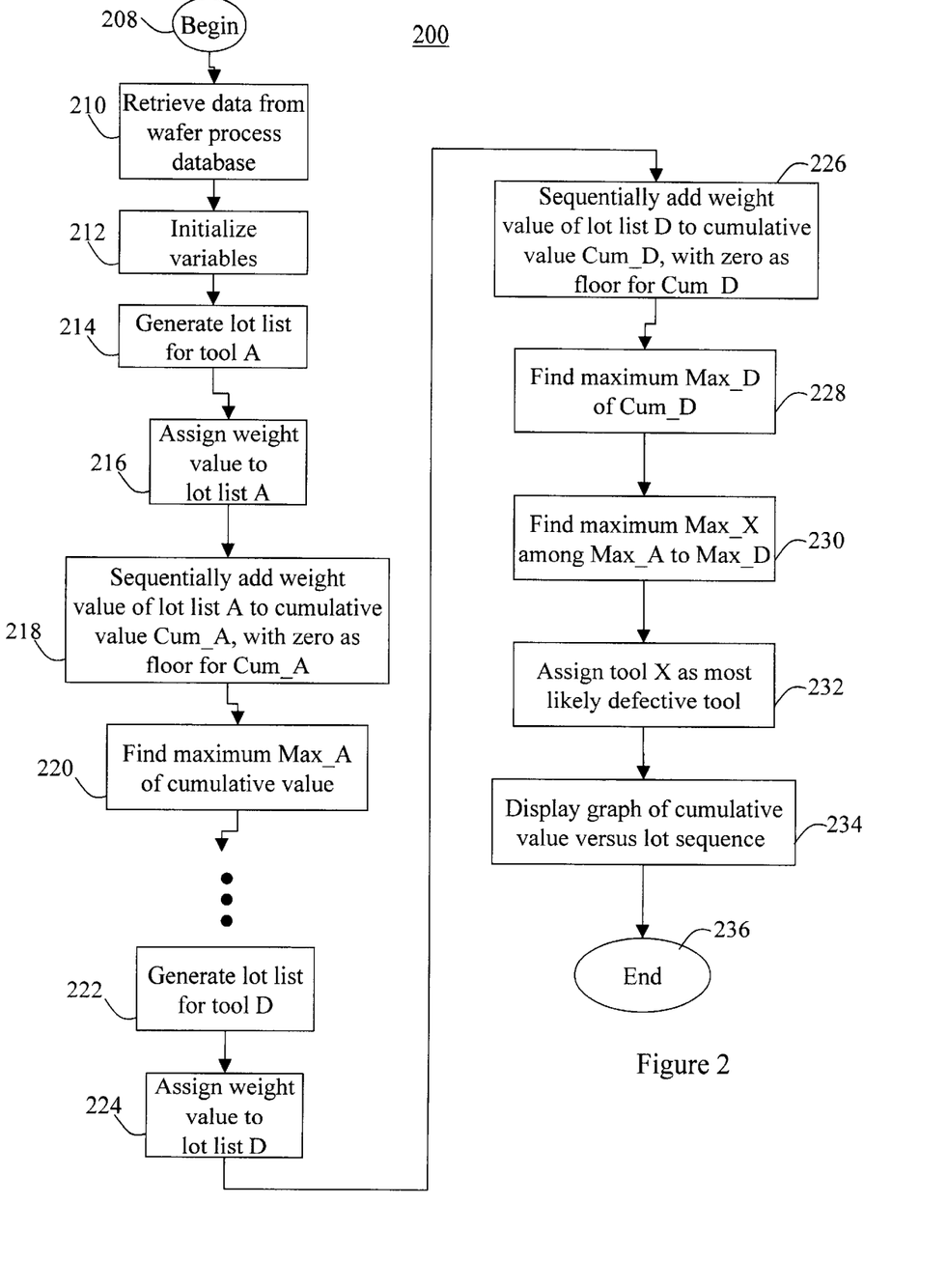
FIG. 2 shows a flowchart of the process used by the equipment commonality analyzer.

Referring to FIG. 2, process 200 is utilized by the equipment commonality analyzer 122 to find the defective tool that caused a particular fail signature. Process 200 begins in block 208. Data is retrieved from the wafer database in block 210. The variables are initialized in block 212. A set of cumulative values, Cum_A, Cum_B, Cum_C, and Cum_D, are set to zero, and the maximum of the cumulative values, Max_A, Max_B, Max_C, and Max_D, are also set to zero. In block 214, a lot list for Tool A (lot list A) is generated, as shown in Table 1.

Table 2 shows the weight values for lot list A. In block 216, weight values are assigned to each lot in lot list A. Preferably, bad lots are assigned a positive weight value, and good lots are assigned a negative weight value. As an example, the bad lots may be assigned a weight value of 20, and the good lots may be assigned a weight value of −10.

The weight values of 20 and −10 are used only for illustrative purposes. The weight values may be changed according to different process designs. For example, a positive weight value of 5 and a negative value of −1 may be used when the length of the lot list is 5 (i.e., there are 5 lots in the lot list). As a second example, a positive weight value of 2 and a negative value of −1 may be used when the length of the lot list is 10. As a third example, the positive weight value may vary according to the certainty that the operator determined that the lot has a failure signature. For example, if it can be determined with more than 90% certainty that a wafer in the lot has the failure signature, then a positive weight value of 5 is assigned to that lot. If it is determined with only 50% certainty that a wafer in the lot has the failure signature, then a positive weight value of 3 is assigned to that lot, etc. Generally, the higher the certainty of a failure signature, the higher the positive weight value.

TABLE 2

| Tool | Lot sequence and weight values | | | | | | | | | | | |
|---|---|---|---|---|---|---|---|---|---|---|---|---|
| Lot list A | 1 | 2 | 3 | 4 | 5 | 6 | 7 | 8 | 9 | 10 | 11 | 12 |
| (weight) | −10 | −10 | −10 | −10 | 20 | 20 | 20 | 20 | 20 | 20 | 20 | −10 |
| Cum_A | 0 | 0 | 0 | 0 | 20 | 40 | 60 | 80 | 100 | 120 | 140 | 130 |
| Lot list B | 1 | 2 | 5 | 3 | 4 | 6 | 7 | 8 | 12 | 9 | 13 | 14 |
| (weight) | −10 | −10 | 20 | −10 | −10 | 20 | 20 | 20 | −10 | 20 | −10 | −10 |
| Cum_B | 0 | 0 | 20 | 10 | 0 | 20 | 40 | 60 | 50 | 70 | 60 | 50 |
| Lot list C | 1 | 2 | 3 | 4 | 5 | 6 | 7 | 8 | 12 | 9 | 13 | 14 |
| (weight) | −10 | −10 | −10 | −10 | 20 | 20 | 20 | 20 | −10 | 20 | −10 | −10 |
| Cum_C | 0 | 0 | 0 | 0 | 20 | 40 | 60 | 80 | 70 | 90 | 80 | 70 |
| Lot list D | 5 | 1 | 2 | 3 | 4 | 6 | 7 | 12 | 8 | 13 | 14 | 9 |
| (weight) | 20 | −10 | −10 | −10 | −10 | 20 | 20 | −10 | 20 | −10 | −10 | 20 |
| Cum_D | 20 | 10 | 0 | 0 | 0 | 20 | 40 | 30 | 50 | 40 | 30 | 50 |

In block 218, the weight values are sequentially added to the cumulative value Cum_A. The value of Cum_A is always kept above or equal to zero. Thus, as seen in Table 2, even though the first four lots of Tool A are "good" (which are assigned negative weight values), the cumulative value, Cum_A, still remains zero. Table 2 shows the values of Cum_A as each weight value of the lot is added to the cumulative value of the previous lot. In block 220, the peak cumulative value Max_A is determined. In this example, Max_A is equal to 140.

Similar steps are performed for Tool B 104 and Tool C 106, including steps for generating a lot list, assigning weight values, adding weight values to obtain cumulative values, and finding the peak cumulative values, etc. These steps are not shown in the figure.

In block 222, the lot list for Tool D 108 (lot list D) is generated, as shown in Table 1. In block 224, weight values are assigned to each lot in lot list D, as shown in Table 2. In block 226, the weight values are sequentially added to cumulative value Cum_D. As the same with Cum_A, the value of Cum_D is always kept above or equal to zero. Table 2 shows the values of Cum_D as each weight value of the lot is added to the cumulative value of the previous lot. In block 228, the peak cumulative value Max_D is determined. In this example, Max_D is 50, as described below in accordance with FIG. 3D.

Figure 3A:
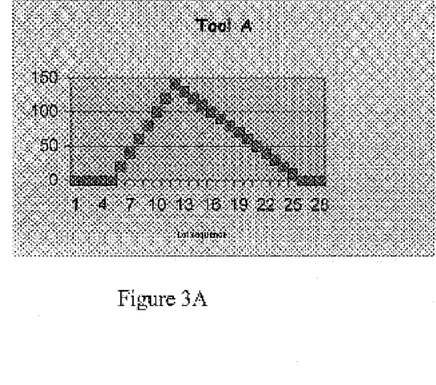
FIGS. 3A–3D show graphs of cumulative values versus lot sequences.
Figure 3B:
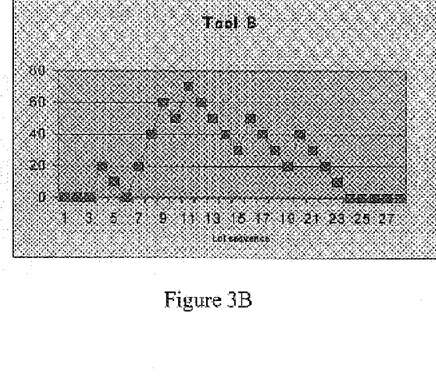
Figure 3C:
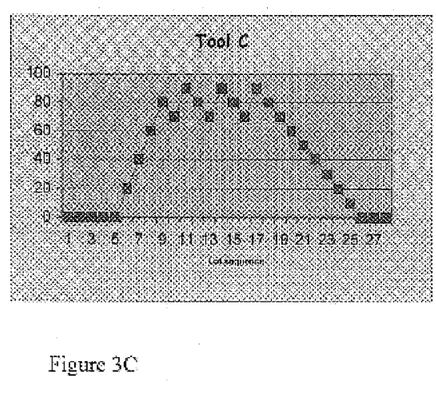
Figure 3D:
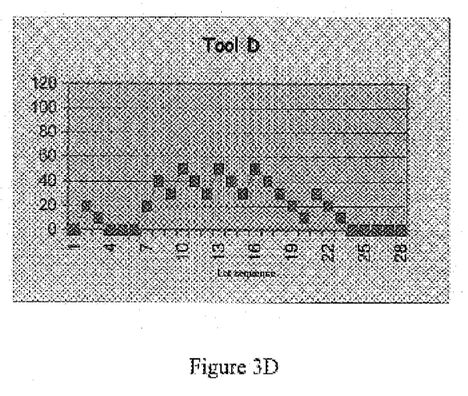

In block 230, the peak values Max_A, Max_B, Max_C, and Max_D are sorted according to magnitude. In this case, Max_A has the highest value of 140. In block 232, Tool A 102 is assigned as the most likely candidate for causing the failure signature on lots #5 through #11. In block 234, a graph showing the cumulative value Cum_A versus the lot sequence is displayed on an output screen. An example of the graphic output representative of Cum_A values is shown in FIG. 3A. The horizontal axis represents the lot sequence, and the vertical axis represents the cumulative value Cum_A. As can be seen from FIG. 3A, there is a succession of bad lots processed by Tool A 102 (the line rises sharply), thus it is highly likely that Tool A 102 is defective and needs maintenance. However, if an operator checks on Tool A 102 and determines that Tool A 102 is normal, then the graph representing the tool with the next highest peak cumulative value is shown. In this example, Tool C 106 has the next highest peak value, with Max_C equal to 90. Thus Tool C 106 is the next most likely candidate for the cause of the failure signature.

The graphic output may also display other useful data in addition to the cumulative values, such as the yield rate and operation numbers of a tool. When a tool is capable of performing several processes, the "operation number" is used to represent which process the tool is performing. FIGS. 4A to 4D show the cumulative values with yield rate and operation numbers for Tool A 102, Tool B 104, Tool C 106, and Tool D 108. The scale for the yield rate and the operation numbers are not shown. Such graphs may allow a semiconductor process engineer to more clearly determine the cause of the failure signature.

Figure 4A:
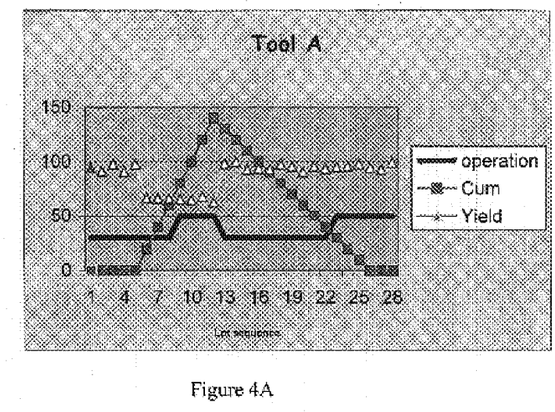
FIGS. 4A–4D show graphs of cumulative values, yield rate, and processing number versus lot sequences.
Figure 4B:
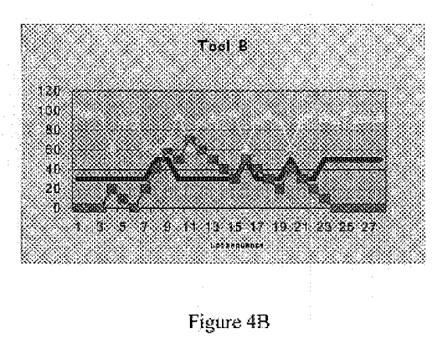
Figure 4C:
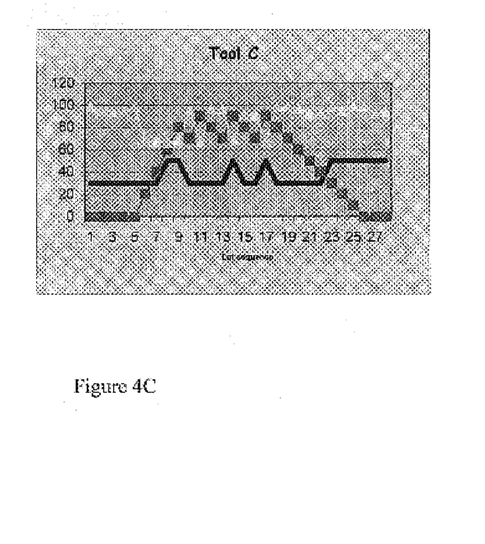
Figure 4D:
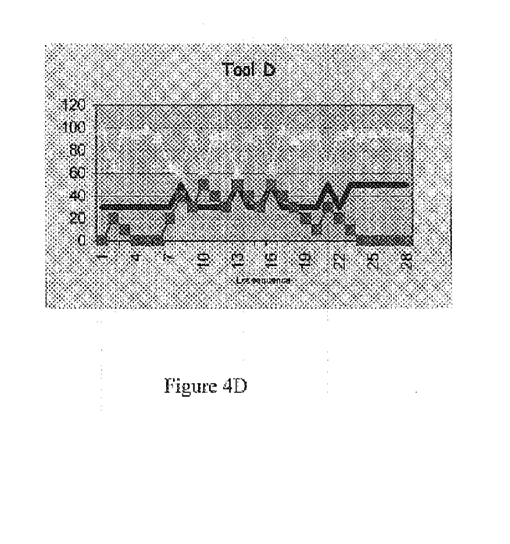
Figure 4E:
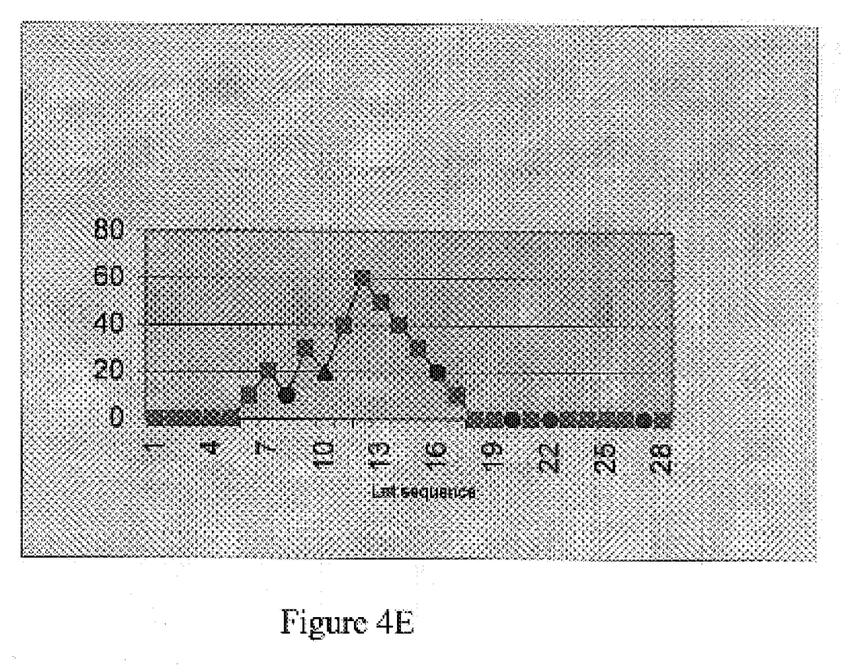
FIG. 4E shows a graph of cumulative values versus lot sequence when there is error in the data.

An advantage of the present invention is that the method described above can still be used to find the defective tool in the fab even if some of the lots have not been tested to determine whether it has a particular fail signature. In addition, the method described above can find the defective tool even if some of the lots were wrongly decided as to whether it has a particular failure mode. When some lots are wrongly decided, the defective tool will still have the highest cumulative value in general. This is because the positive weight value (20 or 5 in the above examples) is larger than the absolute of the negative weight value (−10 or −1), thus the impact of a wrongly decided lot (or an undecided lot) is small. FIG. 4E shows a graph of the cumulative values of a lot list, with the lots 8, 10, 16, 20, 22 and 27 undecided or wrongly decided.

While the preferred embodiment of the invention has been illustrated and described, it will be appreciated that various changes can be made therein without departing from the spirit and scope of the invention. For example, the above description used positive weight values for bad lots and negative weight values for good lots. The bad lots may also be assigned negative weight values, and good lots assigned positive weight values. The cumulative values are kept below or equal to zero. Then the tool with having the most negative peak cumulative value is the tool that most likely caused the failure signature.

I claim:

1. A method for finding a defective tool in a semiconductor fabrication facility having a plurality of tools for processing a plurality of semiconductor wafers, the method comprising the steps of:
    performing a series of wafer processing steps on the plurality of wafers with the plurality of tools;
    generating a database having data representative of the time during which each wafer passed through each of said plurality of tools;
    testing the plurality of wafers to determine whether a wafer is associated with a failure signature;
    generating a lot list for each tool, the sequential order of the lots in the lot list representing the process sequence of the lots;
    assigning a weight value to each lot in the lot list, said weight value being a predetermined positive value for lots having wafers with said failure signature, and said weight value being negative for lots having wafers without said failure signature;
    generating a cumulative value for each tool by sequentially summing the weight values of each lot in the corresponding lot list, and assigning a peak cumulative value for each tool as the maximum cumulative value during the summation process; and
    assigning the tool with the greatest peak cumulative value as the tool most likely to cause said fail signature.

2. The method of claim 1, wherein said the absolute value of said positive weight value is larger than the absolute value of said negative weight value.

3. The method of claim 1, wherein said step of testing the plurality of wafers includes testing performed by an in-line parameter tester before said series of wafer processing steps are completed.

4. The method of claim 1, wherein said step of testing the plurality of wafers includes testing performed by a defect tester after said series of wafer processing steps are completed.

5. The method of claim 1, wherein circuitry is gradually formed on the plurality of wafers during said series of wafer processing steps, and said step of testing the plurality of wafers includes testing the electrical parameters of the circuitry gradually formed on the plurality of wafers.

6. The method of claim 1, wherein said step of testing the plurality of wafers measures the physical properties of the plurality of wafers.

7. The method of claim 5, wherein a wafer is associated with said failure signature when the electrical parameters of a wafer resembles a predetermined failure characteristic pattern.

8. The method of claim 1, wherein after the step of assigning the tool most likely to cause said fail signature further includes a step of displaying a graphical representation of the cumulative values of each tool.

9. The method of claim 1, wherein the step of generating a cumulative value sequentially sums the weight value of each lot in the corresponding lot list, keeping the cumulative value not less than zero during the summation process.

10. A defective tool detection system used in connection with a fabrication facility having a plurality of tools for processing semiconductor wafers that are grouped into a plurality of wafer lots, comprising:
    an electrical parameter tester for receiving the wafer lots and identifying defects on each wafer of the wafer lots;
    a failure signature analyzer for identifying a failure signature representative of defect patterns on the wafers having defects;
    a memory for storing a set of data representative of the time during which each wafer passed through each tool in the fabrication facility; and
    an equipment commonality analyzer for receiving said set of data stored in said memory and said failure signature from said fail signature analyzer in order to generate a peak cumulative value for each tool, wherein a relatively higher peak cumulative value indicates a relatively higher likelihood that the tool is the cause of the failure signature.

11. The defective tool detection system of claim 10, wherein said equipment commonality analyzer performs the following steps:

generating a lot list for each tool in the fabrication facility representative of the sequence in which wafer lots are processed by said each tool;

assigning a weight value to each wafer lot in the lot list;

summing said weight values of the wafer lots in each lot list to obtain a cumulative value, keeping said cumulative value not less than zero during the summation process;

finding said peak cumulative value for each tool that represents the highest value accumulated during the step of summing said weight values; and assigning the tool having the maximum peak cumulative value as the tool most likely to have caused the failure signature.

12. The defective tool detection system of claim 11, wherein wafer lots having wafers with said failure signature are assigned a positive weight value, and wafer lots not having wafers with said failure signature are assigned a negative weight value.

13. The defective tool detection system of claim 12, wherein the absolute value of said positive weight value is larger than the absolute value of said negative weight value.

14. The defective tool detection system in claim 11, further comprising an output display for displaying a graphic plot of the cumulative values versus the lot number for each tool.

15. A method for processing a plurality of semiconductor wafers using commonality analysis to effectively reduce defects on the wafers, the method comprising the steps of:

providing a plurality of tools for processing the plurality of wafers;

processing the plurality of wafers using said plurality of tools and storing time data in a database representing the time period for which each tool processed each wafer;

testing each of the plurality of wafers for a failure signature;

generating a wafer list for each tool representing the process sequence of all wafers that each tool has processed;

assigning a weight value to each wafer in the wafer list;

generating a peak cumulative value for each tool, said peak cumulative value derived from a summation of the weight values; and assigning the tool with the largest peak cumulative value as the tool most likely to have caused said failure signature.

16. The method of claim 15, wherein the step of assigning a weight value to each wafer assigns a positive weight value to wafers having said failure signature, and assigns a negative weight value to wafer not having said failure signature.

17. The method of claim 16, wherein the absolute value of said positive weight value is larger than the absolute value of said negative weight value.

18. The method of claim 15, wherein the step of generating a peak cumulative value for each tool further comprises the steps of:

summing the weight value of each wafer in the wafer list sequentially; and assigning the highest value accumulated during the summation process as the peak cumulative value.

19. The method of claim 15, wherein said failure signature represents a defect pattern caused by mechanical scratches.

20. The method of claim 15, wherein said failure signature represents a center spot defect pattern in which most of the defects are clustered near the center region of the wafer.

21. A method for finding a defective tool among a plurality of tools in a semiconductor fab after a plurality of wafer lots have been processed by the plurality of tools, the method comprising the steps of:

testing each wafer in the plurality of wafer lots for a failure signature; and applying a tool-based commonality analysis to assign peak cumulative values to each of the plurality of tools; and generating a tool list to rank the likelihood of a tool being the cause of the failure signature according to the corresponding peak cumulative values.

22. The method of claim 21, wherein said tool-based commonality analysis performs the steps of:

generating a lot list for each of the plurality of tools representing the process sequence of the wafer lots that each of the plurality of tools have processed;

assigning a weight value to each wafer lot in the lot list;

summing the weight value of each wafer lot in the lot list sequentially to generate a cumulative value, and always keeping the cumulative value not less than zero; and assigning the highest cumulative value during the summation process as the peak cumulative value.

23. The method of claim 21, wherein the step of assigning a weight value to each lot assigns a positive weight value to wafer lots having wafers with said failure signature, assigns a negative weight value to wafer lots not having any wafer with said failure signature, and the absolute value of said positive weight value is greater than the absolute value of said negative weight value.

* * * * *